(12) United States Patent
Li et al.

(10) Patent No.: US 10,561,037 B1
(45) Date of Patent: Feb. 11, 2020

(54) BACKPLANE STRUCTURE

(71) Applicants: K-Tronics (Suzhou) Technology Co., Ltd., Suzhou, Jiangsu (CN); BOE Technology Group Co., Ltd., Beijing (CN)

(72) Inventors: Xiaolai Li, Beijing (CN); Zhou Lu, Beijing (CN)

(73) Assignees: K-TRONICS (SUZHOU) TECHNOLOGY CO., LTD., Suzhou, Jiangsu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/520,731

(22) Filed: Jul. 24, 2019

(30) Foreign Application Priority Data

Nov. 22, 2018 (CN) ...................... 2018 2 1932637 U

(51) Int. Cl.
*H05K 1/02* (2006.01)
*H05K 7/12* (2006.01)

(52) U.S. Cl.
CPC ............ *H05K 7/12* (2013.01); *H05K 1/0284* (2013.01); *H05K 2201/09063* (2013.01)

(58) Field of Classification Search
CPC ... H05K 1/0215; H05K 1/0284; H05K 7/1477
See application file for complete search history.

(56) References Cited

U.S. PATENT DOCUMENTS

| 2013/0128186 | A1* | 5/2013 | Kuo | ................... | G02F 1/133308 |
| | | | | | 349/61 |
| 2013/0258687 | A1* | 10/2013 | Huang | ..................... | F21V 21/00 |
| | | | | | 362/432 |
| 2014/0168527 | A1* | 6/2014 | Tang | ......................... | H04N 5/64 |
| | | | | | 348/794 |
| 2018/0062359 | A1* | 3/2018 | Baillargeon | ......... | H01R 25/162 |

* cited by examiner

*Primary Examiner* — Jeremy C Norris
(74) *Attorney, Agent, or Firm* — Nath, Goldberg & Meyer; Joshua B. Goldberg

(57) ABSTRACT

A backplane structure includes: a backplane; an electronic board having a plurality of first through-holes and a plurality of second through-holes spaced apart from the plurality of the first through-holes, the first through-holes each having a rectangular cross section; a plurality of strutting components, a plurality of connecting pieces, and a plurality of locking components, wherein the plurality of strutting components and the plurality of locking components are both disposed at positions corresponding to the second through-holes and the first through-holes on the backplane, respectively, the plurality of strutting components are fixedly connected to the electronic board via the plurality of connecting pieces, each of the locking components includes an inwardly concave locking slot disposed in a side surface of the locking component perpendicular to the backplane, and each of the locking components is locked with the electronic board via each of first through-holes.

14 Claims, 3 Drawing Sheets

US 10,561,037 B1

BACKPLANE STRUCTURE

CROSS-REFERENCE TO RELATED APPLICATIONS

This application claims the priority to the Chinese application No. 201821932637.4, entitled "Backplane Structure", filed on Nov. 22, 2018, the disclosure of which is incorporated herein by reference in its entirety.

TECHNICAL FIELD

The present disclosure relates to the field of display technology, and particularly to a backplane structure.

BACKGROUND

An electronic board (a printed circuit board, PCB) is usually fixed to a backplane by using a screw to form a backplane structure. As shown in FIGS. 1A and 1B, an electronic board 2 is fixed to a backplane 1 by using four screws 3. In the process of manufacturing of the backplane structure, one person is required to place the electronic board 2 on the backplane 1 and then two others are required to fix the electronic board 2 onto the backplane 1 by using the screws 3 at opposite sides (e.g., left and right sides of the electronic board 2 as shown in FIG. 1A). Such fixing manner requires a large amount of manpower and increases a production cost.

SUMMARY

The present disclosure provides a backplane structure, including: a backplane; an electronic board having a plurality of first through-holes and a plurality of second through-holes spaced apart from the plurality of the first through-holes, the first through-holes each having a rectangular cross section; a plurality of strutting components, a plurality of connecting pieces, and a plurality of locking components, wherein the plurality of strutting components and the plurality of locking components are both disposed at positions corresponding to the plurality of second through-holes and the plurality of first through-holes on the backplane, respectively, the plurality of strutting components are fixedly connected to the electronic board via the plurality of connecting pieces, each of the locking components includes an inwardly concave locking slot in a side surface of the locking component perpendicular to the backplane, and each of the locking components is locked with the electronic board via each of first through-holes to fix the electronic board onto the backplane.

In some embodiments, each of the locking components includes: a body of a cuboid with a first end and a second end opposite to the first end, and a protruding portion of a cuboid extending from the second end in a direction distal to the first end, the extending direction of the protruding portion being obliquely intersected with a center line of the body from the first end to the second end; and the first end is fixedly connected to the backplane, and the locking slot is disposed at the second end and abuts onto a lower surface of the protruding portion adjacent to the first end of the body.

In some embodiments, the protruding portion of each locking component is smoothly connected to an end surface of the second end of the body and a side surface abutting the end surface of the second end.

In some embodiments, the first end of each locking component has a first size in a first direction perpendicular to the extending direction of the locking component, and a second size in a second direction perpendicular to the extending direction of the locking component and the first direction, a size of the locking slot in the first direction is less than or equal to half of the first size of the locking component, a size of the locking slot in the second direction is equal to the second size of the locking component, and an angle between a center line of the protruding portion of the locking component in the extending direction and the center line of the body from the first end to the second end is in a range of about 30° to 60°.

In some embodiments, each of the first through-holes in the electronic board is in clearance fit with each of the locking components, and a fit clearance between a first size of each first through-hole in the first direction and a vertical distance from a farthest side edge of the second end of the corresponding locking component from the protruding portion to the lower surface of the protruding portion abutting the locking slot is no greater than 0.2 mm.

In some embodiments, each of the second through-holes has a circular cross section; each of the connecting pieces has a circular cross section; and each of the connecting pieces is in clearance fit with each of the second through-holes with a fit clearance no greater than 0.2 mm.

In some embodiments, each of the strutting components is provided with a fixing hole at a side adjacent to the electronic board, the fixing hole having a center line in line with that of the corresponding second through-holes in the electronic board and having a same size as the second through-hole; and each of the connecting pieces is provided in the second through-hole and the corresponding fixing hole to fix the electronic board onto the backplane.

In some embodiments, the electronic board includes a first edge and a second edge opposite to the first edge; and the plurality of first through-holes are positioned on the first edge, while the plurality of second through-holes are positioned on the second edge.

In some embodiments, each of the locking components is correspondingly provided with one of the strutting components.

In some embodiments, the locking components and the strutting components have a symmetric structure relative to a central axis in the second direction.

In some embodiments, the backplane is integrally formed with the locking components and the strutting components.

In some embodiments, the connecting pieces include screws.

In some embodiments, a material of the backplane includes a metal and a plastic.

In some embodiments, the metal includes iron.

DETAILED DESCRIPTION

To improve understanding of the technical solution of the present disclosure for those skilled in the art, the present disclosure will now be described in detail in conjunction with drawings and specific embodiments.

Unless otherwise defined, technical or scientific terms used in the present disclosure are intended to have general meanings as understood by those of ordinary skill in the art. The words "first," "second," and similar expressions in the present disclosure do not denote any order, quantity, or importance, but are merely for distinguishing between different entities or parameters. The word "comprise" or "include" or the like means that an element or item preceding the word covers an element or item or the equivalent that appears after the word without excluding other elements or items. The words "upper", "lower", "left", "right", or the like are merely used to indicate a relative positional relationship, and when an absolute position of the described object is changed, the relative positional relationship may also be changed accordingly.

Figure 1A:
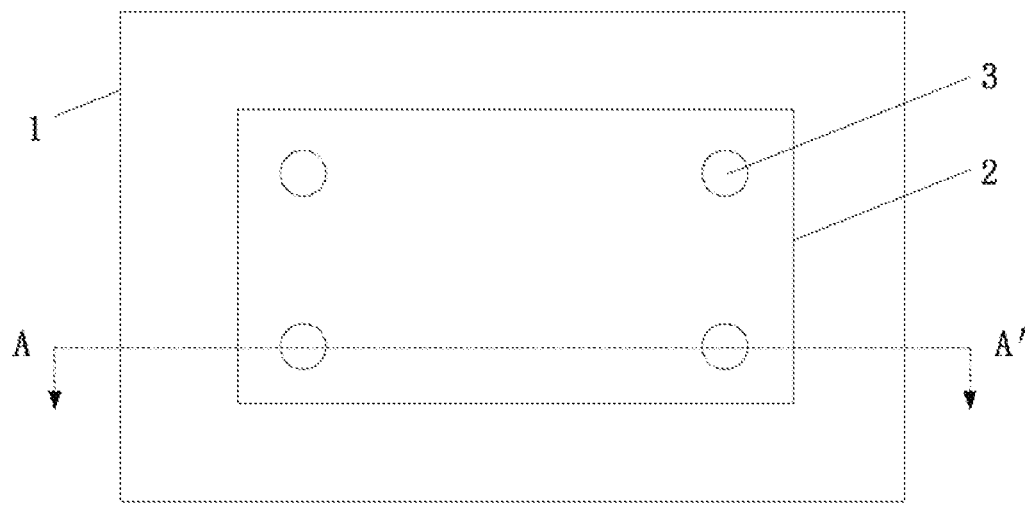
FIG. 1A is a schematic diagram of a backplane structure in related art.
Figure 1B:
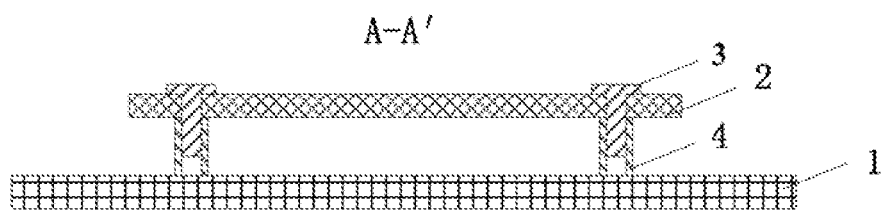
FIG. 1B is a cross-sectional view of the backplane structure in related art taken along line AA'.
Figure 2A:
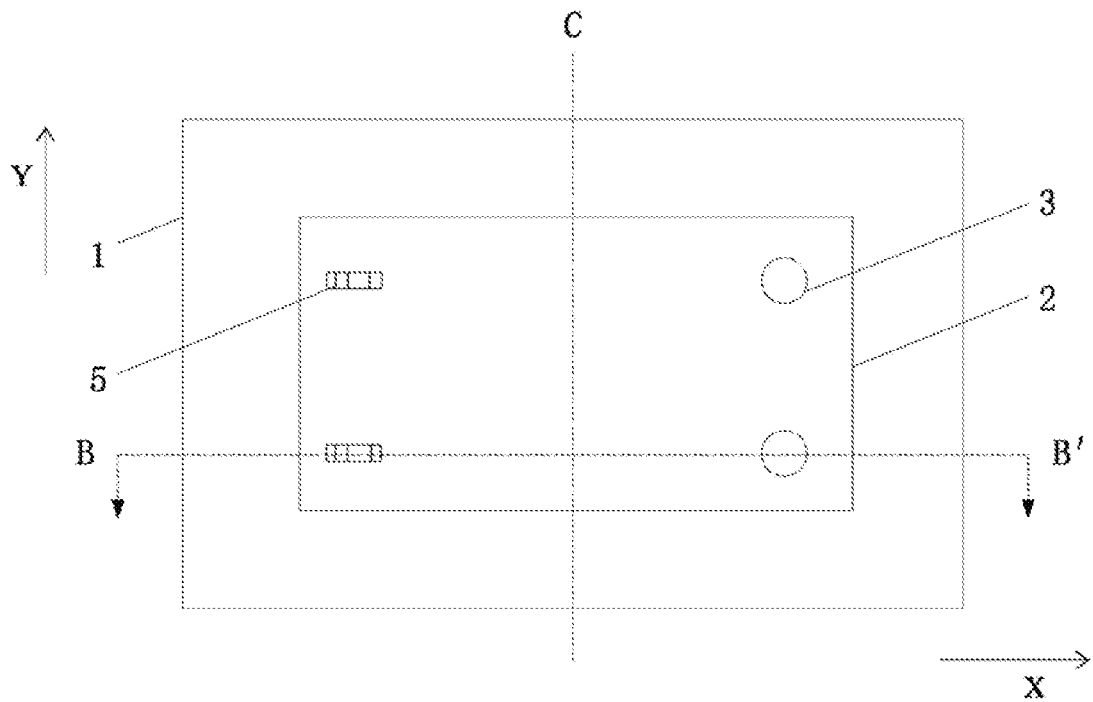
FIG. 2A is a schematic diagram of a backplane structure according to an embodiment of the present disclosure.

As shown in FIG. 2A, the present disclosure provides a backplane structure including a backplane 1, an electronic board 2, and locking components 5. The electronic board 2 has a plurality of first through-holes 21 and a plurality of second through-holes 22 spaced apart from the first through-holes 21. Each of the locking components 5 is disposed on the backplane 1 at a position corresponding to one of the first through-holes 21, and is connected to the electronic board 2 by locking with the corresponding first through-hole 21 in the electronic board 2 to fix the electronic board 2 onto the backplane 1.

In the embodiment, the electronic board 2 is fixed onto the locking components 5, i.e., onto the backplane 1, by locking the locking components 5 with the corresponding first through-holes 21 in the electronic board 2, thereby eliminating the process of fixing the electronic board 2 onto the backplane 1 by means of screws 3 in related art. That is, it is not required for a large amount of manpower to secure the screws 3. Thus, the manpower involved in production and the production cost are reduced.

Figure 2B:
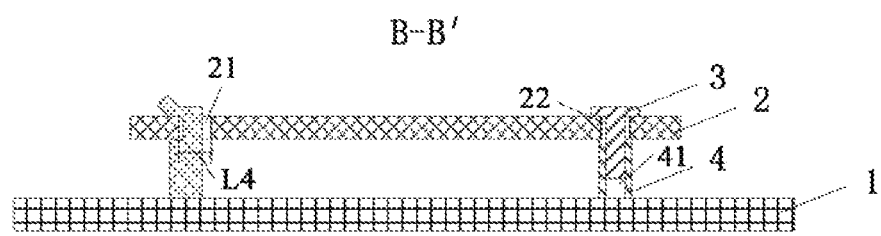
FIG. 2B is a cross-sectional view of the backplane structure according to an embodiment of the present disclosure taken along line BB'.
Figure 2C:
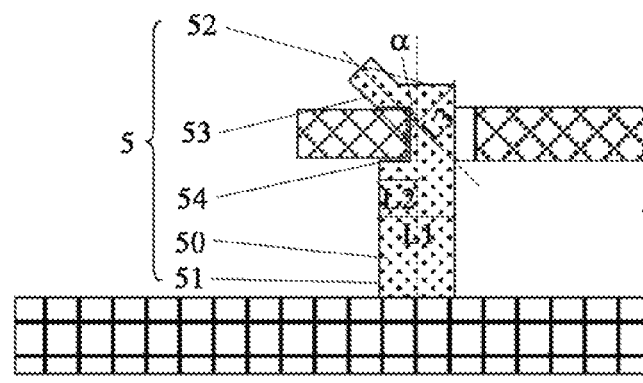
FIG. 2C is an enlarged partial view of a locking component of FIG. 2B.

As shown in FIGS. 2B and 2C, each locking component 5 of the embodiment includes a cuboid body 50 having a first end 51 and a second end 52 opposite to the first end 51. The first end 51 of the body is integrated with the backplane 1 to fix the locking component 5 to the backplane 1. A locking slot 54 is provided at a position adjacent to the second end 52 in a side surface of the body 50 perpendicular to the backplane 1. The locking slot 54 is an inwardly concave hole and locked with the electronic board via the corresponding first through-hole 21 in the electronic board 2 to fix the electronic board 2 onto the backplane 1.

Each locking component 5 of the embodiment includes: a cuboid body 50 having a first end 51 and a second end 52 opposite to the first end 51, and a protruding portion 53 having a rectangular longitudinal section and extending obliquely from the second end 52 in a direction distal to the first end 51. An angle between the extending direction of the protruding portion and the extending direction of the body from the first end to the second end is in a range of about 30° to 60°. The protruding portion is smoothly connected to an end surface of the second end and a side surface of the body. The first end 51 of the body is integrated with the backplane 1 to fix the locking component 5 onto the backplane 1. A locking slot 54 is provided at a position next to the protruding portion 53 in the second end 52 of the body, and is locked with the electronic board via the corresponding first through-hole 21 in the electronic board 2 to fix the electronic board 2 onto the backplane 1. The first end 51 of the body 50 has a first size L1 in a direction X (a first direction) as shown in the figure, and a second size in a direction Y (a second direction). The locking slot 54 has a size L2 along the first direction, where L2 is less than or equal to half of L1. An angle α between a center line of the protruding portion 53 and a center line of the body 50 may be 30° to 60°. An extension length of the protruding portion 53 may be adjusted as needed, and thus is not limited herein.

A size L4 of each of the first through-holes 21 in the electronic board 2 in the first direction is required to be greater than a vertical distance L3 from a farthest side edge of the second end 52 of the corresponding locking component from the protruding portion 53 to a surface of the protruding portion 53 abutting the locking slot 54. A tolerance clearance between a first through-hole 21 and a maximum size of the corresponding locking component in a direction perpendicular to the extending direction of the locking component is no greater than 0.2 mm.

Figure 3:
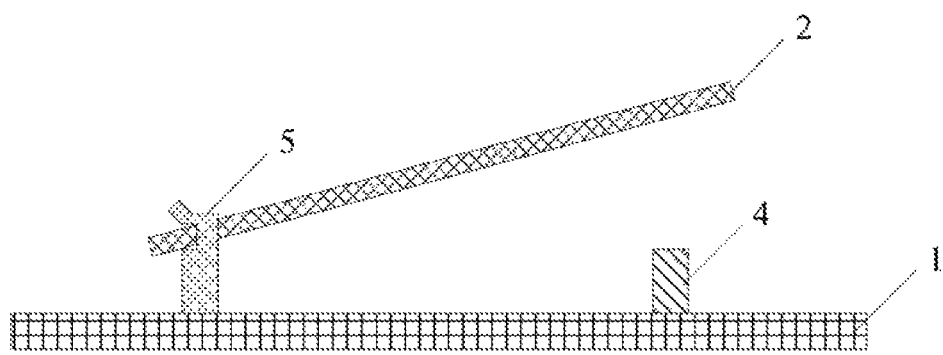
FIG. 3 is a schematic diagram of an electronic board locked with a locking component according to an embodiment of the present disclosure.

In this way, when the electronic board 2 is locked with the locking components 5, the electronic board 2 needs to be tilted. Specifically, as shown in FIG. 3, a left side of the electronic board 2 is tilted downward so that each of the first through-holes 21 on the left side may reach the locking slot 54 of the corresponding locking component 5 through the protruding portion of the locking component 5 and thus the entire electronic board 2 is locked with the locking component 5.

In order to fix the electronic board 2 of the embodiment more securely on the backplane 1, the structure of the backplane 1 of the embodiment further includes: strutting components 4, and connecting pieces. Each of the strutting components 4 is disposed on the backplane 1 and provided with a fixing hole 41 at a side of the strutting component 4 adjacent to the electronic board 2. Each of the fixing holes 41 has a same size as each of the second through-holes 22, and disposed at a position corresponding to one of the second through-holes 22 in the electronic board 2. Each of the connecting pieces, the second through-holes and the fixing holes has a circular cross section. Each of the connecting pieces is provided in the corresponding second through-hole 22 and the fixing hole 41 and is in clearance fit with the corresponding second through-hole 22 by a fit clearance no greater than 0.2 mm so that the electronic board 2 is fixed onto the backplane 1. The connecting pieces of the embodiment may be screws 3, but obviously are not limited thereto and are not limited herein.

In this embodiment, not only the electronic board 2 is fixed onto the backplane 1 by means of locking, but also the strutting components 4 are used to fixe to the electronic board 2 by the connecting pieces, that is, the electronic board 2 is further fixed onto the backplane 1, thereby enhancing the stability of the electronic board 2 on the backplane 1.

A detailed description is made of how to fix the electronic board 2 onto the backplane 1 using the locking components 5, the strutting components 4, and the connecting pieces as below.

In this embodiment, an electronic board 2 having a first edge and a second edge opposite to each other is taken as an example for illustration. A left edge of the electronic board 2 shown in FIG. 2A corresponds to the first edge, and a right edge of the electronic board 2 shown in FIG. 2A corresponds to the second edge.

The plurality of through-holes in the electronic board 2 include a plurality of first through-holes 21 on the left edge of the electronic board 2 and a plurality of second through-holes 22 on the right edge of the electronic board 2. Each of the first through-holes 21 is correspondingly provided with one of the locking components 5; and each of the second through-holes 22 is correspondingly provided with one of the strutting components 4.

It can be seen that in the embodiment, there are a plurality of locking components 5 spaced apart on the left edge of the backplane 1, each of which is inserted in a corresponding first through-hole 21 to fix the electronic board 2 onto the backplane 1. Correspondingly, in the embodiment, there are a plurality of strutting components 4 spaced apart on the right edge of the backplane 1, each of which is provided with a fixing hole 41 at a position corresponding to one of the second through-holes 22 at a side adjacent to the electronic board 2. Each of the connecting pieces is placed in the fixing hole 41 and the corresponding second through-hole 22 and fixes the electronic board 2 onto the backplane 1.

In some embodiments, each of the locking components 5 is correspondingly provided with one of the strutting components 4. Thus, the plurality of locking components 5 and the plurality of strutting components 4 are symmetrically disposed relative to a central axis of the electronic board 2 (i.e., the line segment C as shown in FIG. 2A). In this way, the electronic board 2 is evenly stressed when being fixed to the backplane 1 by means of the locking components 5, the strutting components 4 and the connecting pieces, thereby avoiding damage to the electronic board 2 due to an uneven stress on the electronic board 2.

In some embodiments, the backplane 1 of the embodiment is integrally formed with the locking components 5 and the strutting components 4. Such arrangement of the structure simplifies the preparation process of the structure of the backplane 1.

In some embodiments, a material of the backplane 1 includes metal and plastic, and the metal may be iron. Obviously, the material of the backplane 1 is not limited to the aforementioned materials, and is not limited herein.

In summary, in the embodiment, the backplane 1 is provided with a plurality of locking components disposed apart from each other on the left edge and a plurality of strutting components 4 disposed apart from each other on the right edge, and each of the locking components 5 and each of the fixing holes 41 on the strutting components 4 are disposed corresponding to one of the first through-holes 21 and one of the second through-holes 22 in the electronic board 2 respectively. As a result, when the electronic board 2 is fixed onto the backplane 1 in the embodiment, only one person is needed to lift the electronic board 2, and place the first through-holes 21 on the left edge of the electronic board 2 on the respective locking components 5 located on the left edge of the backplane 1 so that the left edge of the electronic board 2 is fixed on the backplane 1. Then, another person is needed to rotate the electronic board 2 so that the second through-holes 22 on the right edge of the electronic board 2 correspond to the fixing holes 41 on the strutting components 4, and then use the connecting pieces to connect the second through-holes to the fixing holes 41 so that the right edge of the electronic board 2 is fixed. It can be seen that in the embodiment, compared with related art where three persons are needed, only two persons are needed to fix the electronic board 2 onto the backplane 1. In this way, when batches of electronic boards 2 are required to be fixed on the backplanes 1, the involved manpower in production, the working hours, as well as the production cost can be greatly reduced.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall within the protection scope of the disclosure.

What is claimed is:

1. A backplane structure, comprising:
a backplane;
an electronic board having a plurality of first through-holes and a plurality of second through-holes spaced apart from the plurality of the first through-holes, the first through-holes each having a rectangular cross section;
a plurality of strutting components,
a plurality of connecting pieces, and
a plurality of locking components,
wherein the plurality of strutting components and the plurality of locking components are both disposed at positions corresponding to the plurality of second through-holes and the plurality of first through-holes on the backplane, respectively, the plurality of strutting components are fixedly connected to the electronic board via the plurality of connecting pieces, each of the locking components comprises an inwardly concave locking slot in a side surface of the locking component perpendicular to the backplane, and each of the locking components is locked with the electronic board via each of first through-holes to fix the electronic board onto the backplane.

2. The backplane structure according to claim 1, wherein each of the locking components comprises: a body of cuboid with a first end and a second end opposite to the first end, and a protruding portion of cuboid extending from the second end in a direction distal to the first end, the extending direction of the protruding portion being obliquely intersected with a center line of the body from the first end to the second end; and
the first end is fixedly connected to the backplane, and the locking slot is disposed at the second end and abuts onto a lower surface of the protruding portion adjacent to the first end of the body.

3. The backplane structure according to claim 2, wherein the protruding portion of each locking component is smoothly connected to an end surface of the second end of the body and a side surface abutting the end surface of the second end.

4. The backplane structure according to claim 3, wherein the first end of each locking component has a first size in a first direction perpendicular to the extending direction of the locking component, and a second size in a second direction perpendicular to the extending direction of the locking component and the first direction, a size of the locking slot in the first direction is less than or equal to half of the first size of the locking component, a size of the locking slot in the second direction is equal to the second size of the locking component, and an angle between a center line of the protruding portion of the locking component in the extending direction and the center line of the body from the first end to the second end is in a range of about 30° to 60°.

5. The backplane structure according to claim 4, wherein each of the first through-holes in the electronic board is in clearance fit with each of the locking components, and a fit clearance between a first size of each first through-hole in the first direction and a vertical distance from a farthest side edge of the second end of the corresponding locking component from the protruding portion to the lower surface of the protruding portion abutting the locking slot is no greater than 0.2 mm.

6. The backplane structure according to claim 5, wherein each of the second through-holes has a circular cross section;

each of the connecting pieces has a circular cross section; and each of the connecting pieces is in clearance fit with each of the second through-holes with a fit clearance no greater than 0.2 mm.

7. The backplane structure according to claim 6, wherein each of the strutting components is provided with a fixing hole at a side adjacent to the electronic board, the fixing hole having a centre line in line with that of the corresponding second through-holes in the electronic board and having a same size as the second through-hole; and each of the connecting pieces is provided in the second through-hole and the corresponding fixing hole to fix the electronic board onto the backplane.

8. The backplane structure according to claim 7, wherein the electronic board comprises a first edge and a second edge opposite to the first edge; and the plurality of first through-holes are positioned on the first edge, while the plurality of second through-holes are positioned on the second edge.

9. The backplane structure according to claim 8, wherein each of the locking components is correspondingly provided with one of the strutting components.

10. The backplane structure according to claim 9, wherein the locking components and the strutting components are symmetric relative to a central axis in the second direction.

11. The backplane structure according to claim 10, wherein the backplane is integrally formed with the locking components and the strutting components.

12. The backplane structure according to claim 1, wherein the connecting pieces comprise screws.

13. The backplane structure according to claim 1, wherein a material of the backplane comprises a metal and a plastic.

14. The backplane structure according to claim 13, wherein the metal comprises iron.

* * * * *